(12) United States Patent
Ford

(10) Patent No.: US 10,262,821 B2
(45) Date of Patent: Apr. 16, 2019

(54) ENVIRONMENTALLY PROTECTED SWITCH FOR ACTIVATING AN ELECTRONIC DEVICE WHEN SUBMERSED IN A CONDUCTING FLUID

(71) Applicant: 9609385 CANADA INC., Beaconsfield (CA)

(72) Inventor: Timothy D. F. Ford, Beaconsfield (CA)

(73) Assignee: 9609385 CANADA INC., Beaconsfield (CA)

( * ) Notice: Subject to any disclaimer, the term of this patent is extended or adjusted under 35 U.S.C. 154(b) by 33 days.

(21) Appl. No.: 15/326,255

(22) PCT Filed: Jul. 15, 2015

(86) PCT No.: PCT/CA2015/050662
§ 371 (c)(1),
(2) Date: Jan. 13, 2017

(87) PCT Pub. No.: WO2016/008050
PCT Pub. Date: Jan. 21, 2016

(65) Prior Publication Data
US 2017/0200575 A1    Jul. 13, 2017

Related U.S. Application Data

(60) Provisional application No. 62/024,591, filed on Jul. 15, 2014.

(51) Int. Cl.
*H01H 35/18*    (2006.01)
*H01H 36/00*    (2006.01)
(Continued)

(52) U.S. Cl.
CPC ............ *H01H 35/18* (2013.01); *F21S 9/022* (2013.01); *F21V 17/002* (2013.01); *F21V 17/06* (2013.01);
(Continued)

(58) Field of Classification Search
CPC ........ H01H 35/18; H01H 29/00; H01H 29/04; H01H 29/06; H01H 29/16; H01H 36/006;
(Continued)

(56) References Cited

U.S. PATENT DOCUMENTS 1,844,413 A * 2/1932 Walker ................... H01H 29/24
200/183
1,991,350 A * 2/1935 Green .................... H01H 29/04
174/50.5
(Continued)

FOREIGN PATENT DOCUMENTS

| CA | 2338506 | 8/2002 |
| WO | 2010003246 | 1/2010 |

OTHER PUBLICATIONS

The Flewelling Ford Family Trust, Oct. 21, 2015, PCT International Preliminary Report on Patentability, PCT/CA2015/050662, pp. 1-10.*

(Continued)

*Primary Examiner* — Alan B Cariaso
(74) *Attorney, Agent, or Firm* — Hugh Mansfield

(57) ABSTRACT

An environmentally protected switch and water activated device using the switch is disclosed. The switch comprises an elongate housing having an open end and divided into a pair of chambers and into which a probe is inserted. When water infiltrates the housing an electrical circuit is completed between the two probes. There is also disclosed a lens/selector assembly comprising a selector ring encircling a lens and a wave spring which biases the selector ring into one of a number of predetermined positions around the lens. Illustratively, a magnet is placed within the selector ring a position of which can be detected by electronics within the lens.

18 Claims, 8 Drawing Sheets

(51) Int. Cl.
  *F21V 23/04* (2006.01)
  *F21S 9/02* (2006.01)
  *F21V 17/18* (2006.01)
  *H01H 29/16* (2006.01)
  *F21V 17/00* (2006.01)
  *F21V 17/06* (2006.01)
  *F21V 17/10* (2006.01)
  *F21V 17/16* (2006.01)
  *F21V 23/00* (2015.01)
  *F21V 25/00* (2006.01)
  *F21V 31/03* (2006.01)
  *F21V 33/00* (2006.01)
  *H05K 1/18* (2006.01)

(52) U.S. Cl.
  CPC ............ *F21V 17/105* (2013.01); *F21V 17/16* (2013.01); *F21V 23/005* (2013.01); *F21V 23/0407* (2013.01); *F21V 25/00* (2013.01); *F21V 31/03* (2013.01); *F21V 33/0076* (2013.01); *H01H 29/16* (2013.01); *H01H 36/006* (2013.01); *H05K 1/18* (2013.01); *F21V 17/18* (2013.01); *H05K 2201/10106* (2013.01)

(58) Field of Classification Search
  CPC ........... F21S 9/022; H05K 2201/10106; F21V 23/005; F21V 23/0407; F21V 33/0076; F21V 17/06; F21V 17/16; F21V 17/18

USPC ...... 362/158, 186; 340/573.6; 200/182, 183, 200/184, 215, 216, 233
  See application file for complete search history.

(56) References Cited

U.S. PATENT DOCUMENTS

| | | | | |
|---|---|---|---|---|
| 4,796,167 | A | * | 1/1989 | Brown ..................... B63C 9/21 116/DIG. 7 |
| 5,311,100 | A | | 5/1994 | Ford et al. |
| 5,748,080 | A | * | 5/1998 | Clay ..................... B63C 9/0005 340/539.26 |
| 6,669,352 | B2 | * | 12/2003 | McKinney ................ F21S 9/02 362/101 |
| 7,648,255 | B2 | * | 1/2010 | Lewis ................. F21V 33/0028 362/101 |
| 8,337,040 | B1 | * | 12/2012 | Easley ................... F21L 13/00 362/183 |
| 2005/0087702 | A1 | | 4/2005 | Ford et al. |
| 2007/0153523 | A1 | * | 7/2007 | Thornhill ............... F21V 15/01 362/276 |

OTHER PUBLICATIONS

International Search Report of corresponding application PCT/CA2015/050662.

* cited by examiner

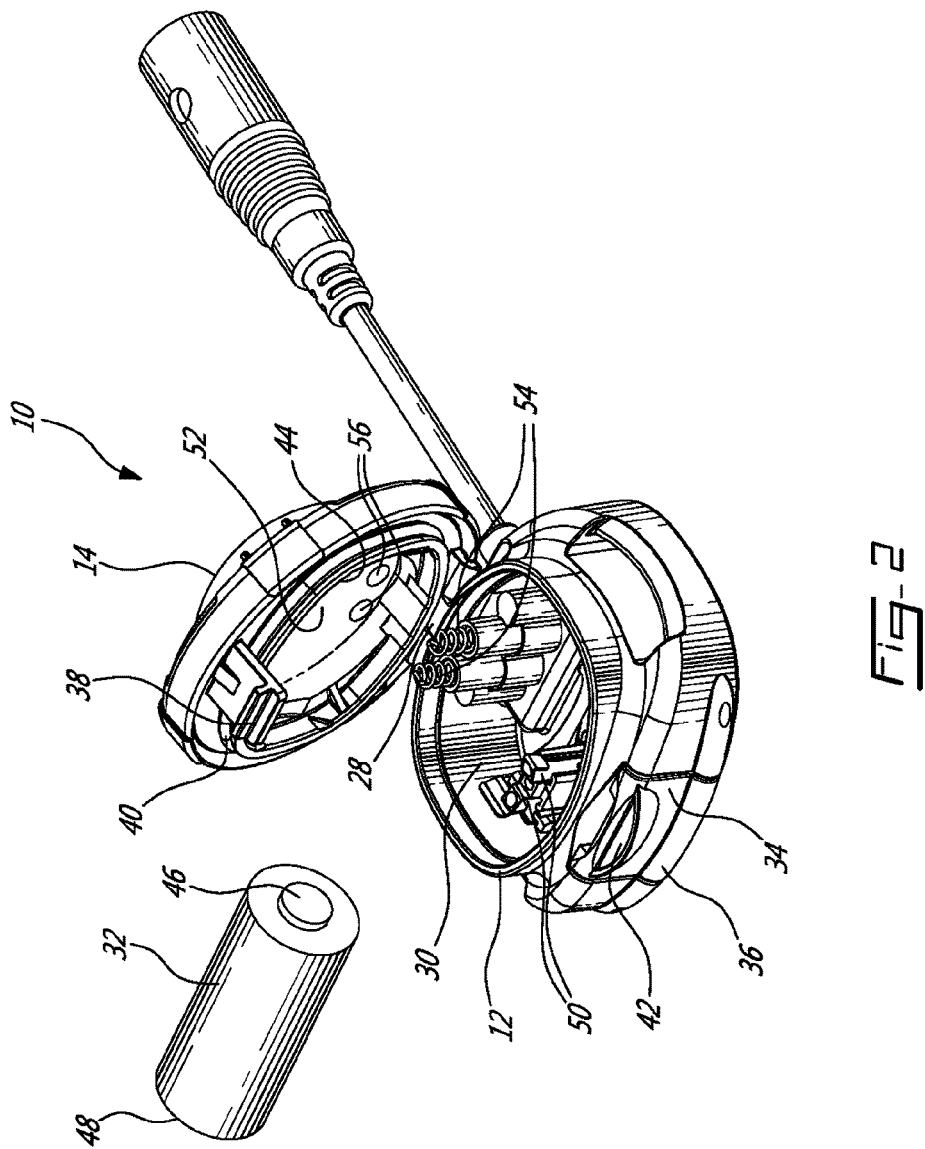

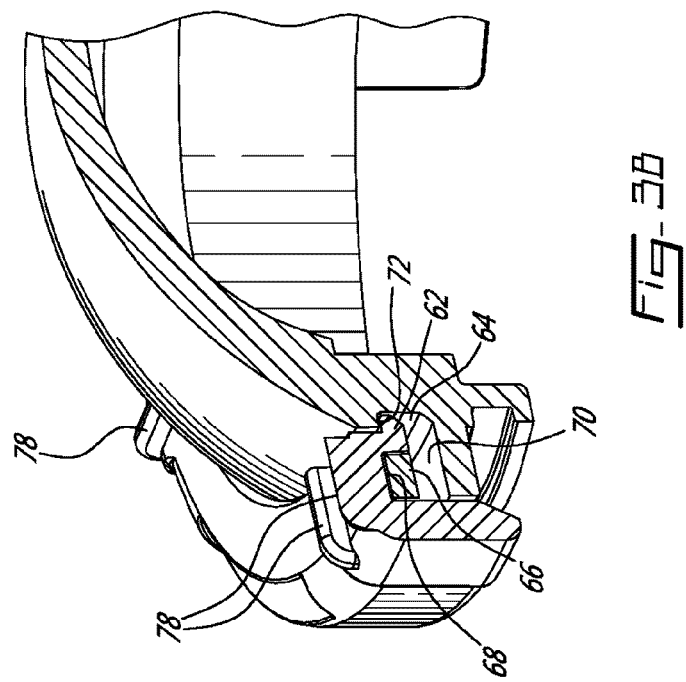
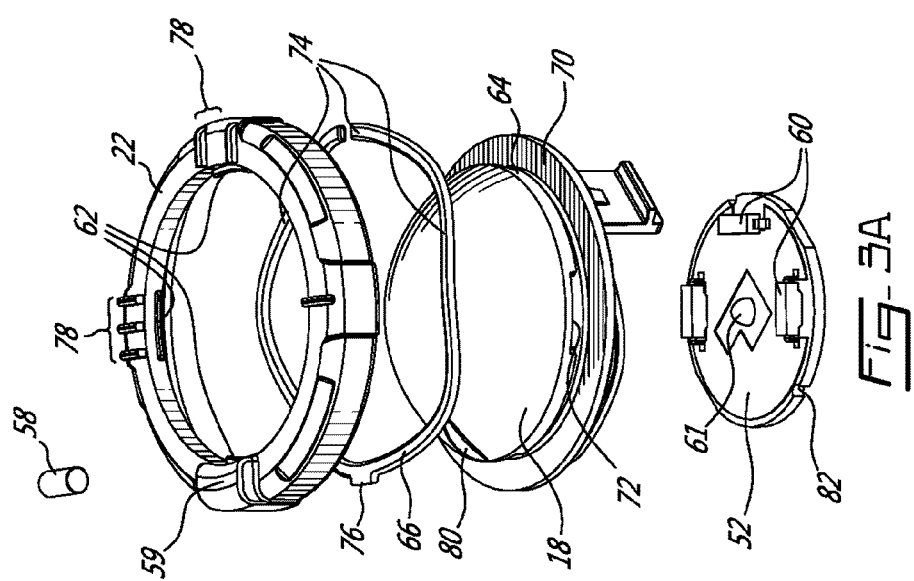

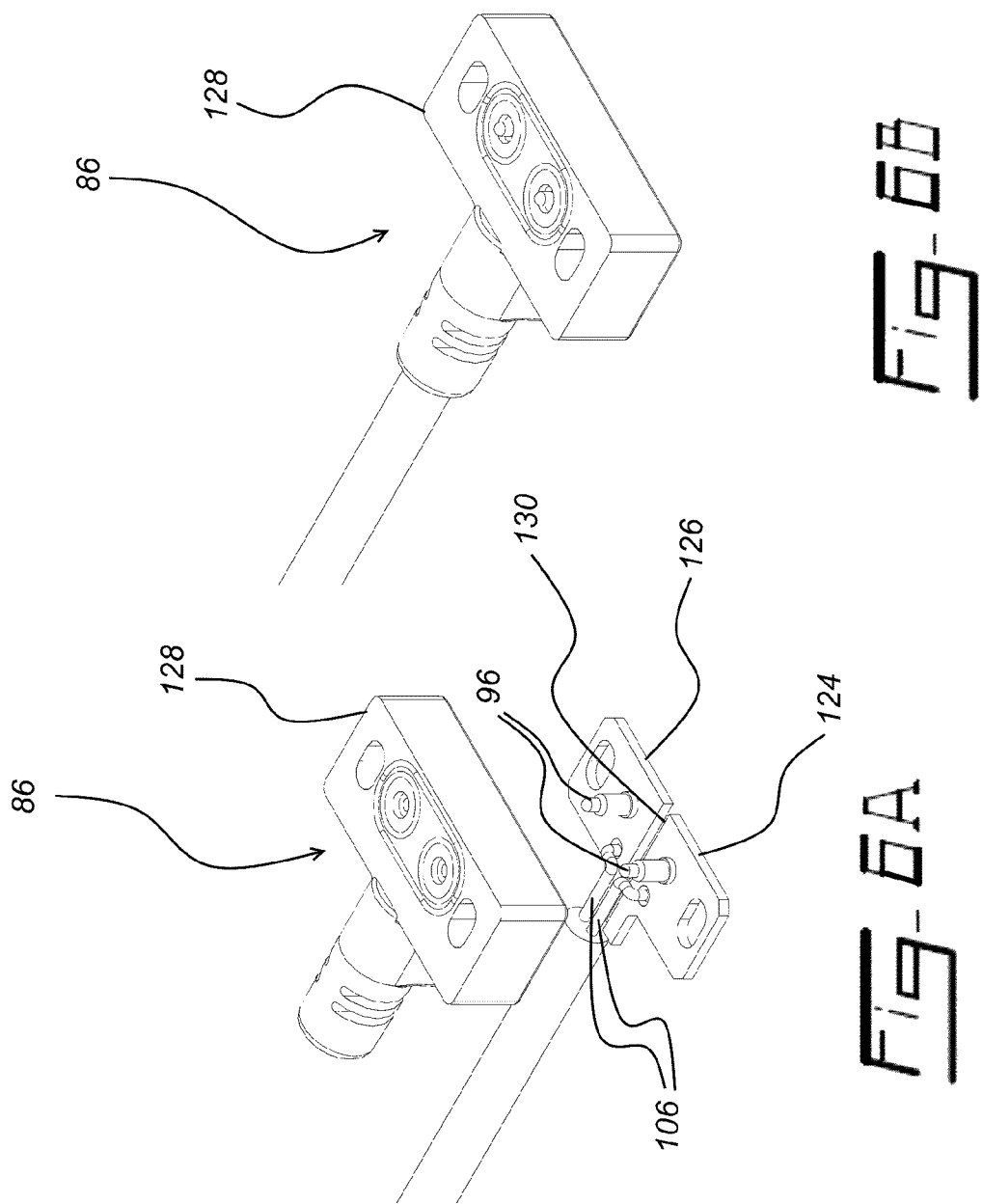

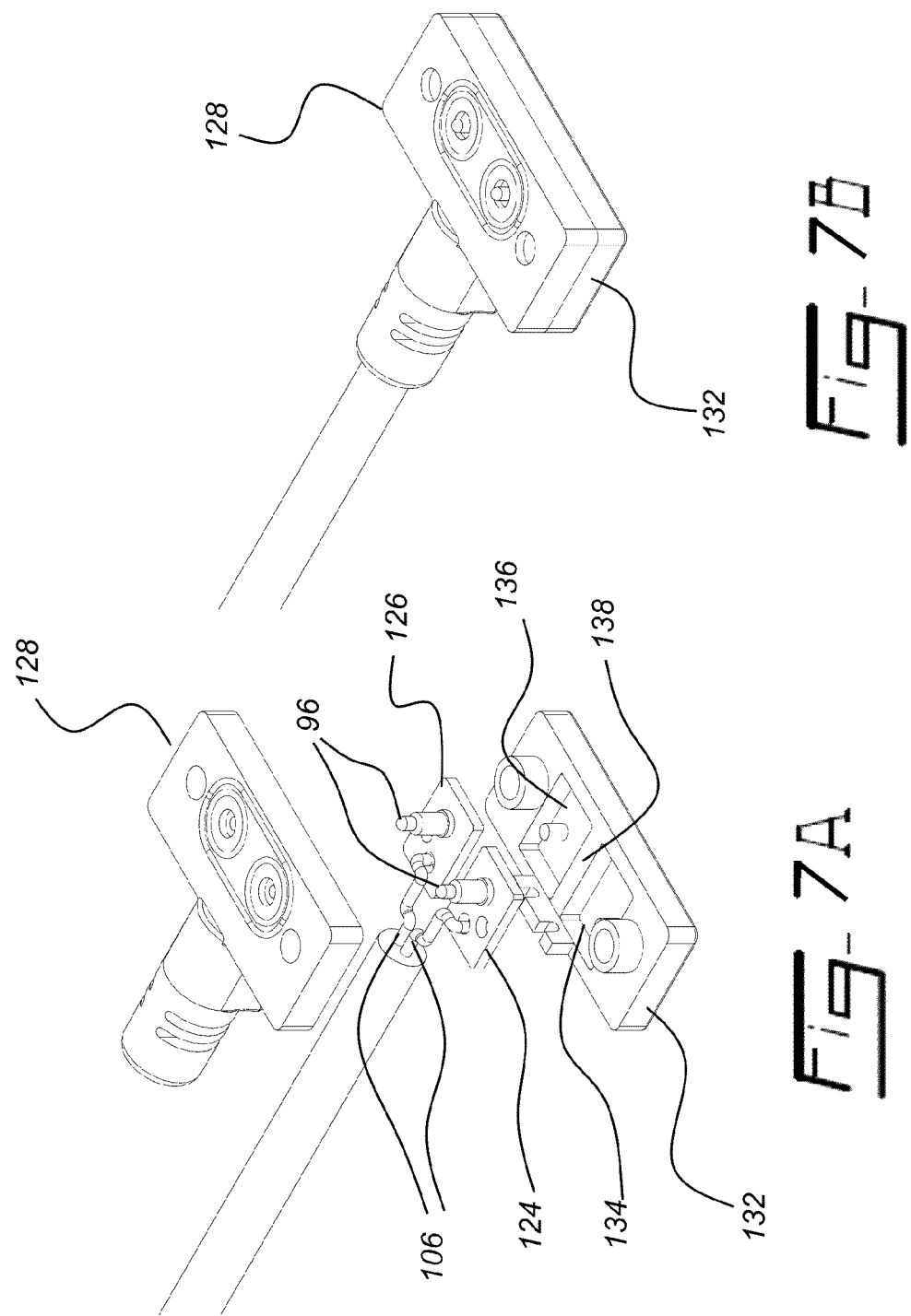

ENVIRONMENTALLY PROTECTED SWITCH FOR ACTIVATING AN ELECTRONIC DEVICE WHEN SUBMERSED IN A CONDUCTING FLUID

CROSS REFERENCE TO RELATED APPLICATIONS

This application claims benefit, under 35 U.S.C. § 119(e), of U.S. provisional application Ser. No. 62/024,591, filed on Jul. 15, 2014. All documents above are incorporated herein in their entirety by reference.

FIELD OF THE INVENTION

The present invention relates to an environmentally protected switch and device using same.

BACKGROUND

Safety lights and other devices foreseen for use in emergency situations involving the risk of drowning or the like often include sensors for detecting the presence of water. These sensors provide an indication, for example, that they are submersed in water which can be used by the device to enter a different state, for example triggering an alarm or illuminating a light or the like. Some prior art sensors suffer the drawback that they are easily triggered by splashing or the like which, although an indication that water is present, does not necessarily indicate that the sensor has been submersed. Other prior art sensors, although resistant against the intermittent effects of splashing, suffer adversely from corrosion and may give rise to false readings if exposed repeatedly to a corrosive environment.

SUMMARY OF THE INVENTION

In order to address the above and other drawbacks, there is provided an environmentally protected switch for activating an electronic device in the presence of a conductive fluid. The switch comprises an elongate housing comprising an open end, a partition dividing the housing longitudinally into two elongate chambers, and a flexible insulated two conductor cable, each of the conductors coupleable at a first end to the electronic device and terminated at a second end by a respective one of a pair of probes wherein each of the probes is positioned in a respective one of the elongate chambers and at an end opposite the opening. Upon submersion of the housing into the conductive fluid, the fluid penetrates each of the chambers, the conductive fluid electrically interconnecting the first probe and the second probe to enable an electrical current to flow between the first probe and the second probe for closing an electrical path and activating the electronic device.

There is also provided a water activated device comprising a battery, a light source comprising at least one LED, an environmentally protected switch for activating an electronic device in the presence of a conductive fluid, the switch comprising a hollow elongate housing comprising an open end, a partition dividing the elongate housing longitudinally into two elongate chambers, and a flexible insulated two conductor cable, each of the conductors coupleable at a first end between the battery and the light source and terminated at a second end by a respective one of a pair of probes wherein each of the probes is positioned in a respective one of the elongate chambers and at an end opposite the opening, wherein upon submersion of the elongate housing into the water, the water penetrates each of the chambers, the water electrically interconnecting the first probe and the second probe to enable an electrical current to flow between the first probe and the second probe for closing an electrical path between the battery and the light source and illuminating the at least one LED.

Additionally, there is provided a lens/selector assembly comprising a lens comprising a cylindrical outer side wall, a tab receiving groove ringing the cylindrical outer side wall and an annular ledge adjacent the groove, a selector ring mounted for rotation about the cylindrical outer side wall, the selector ring comprising an inner surface defining an aperture sized for receiving the cylindrical outer side wall therein, and a plurality of tabs spaced along the inner surface and projecting inwards towards the lens, the tabs engaging with and held within the tab receiving groove, the tab receiving groove further comprising a plurality of notches spaced along the groove, each of the notches dimensioned to receive one of the tabs, and a wave spring positioned between the annular ledge and the selector ring, the wave spring biasing the plurality of tabs against the groove and such that when each of the plurality of tabs is positioned adjacent a respective one of the notches, the tabs are biased into the notches thereby preventing the selector ring from being rotated, wherein a user disengages the tabs from the notches by pressing the selector ring against a biasing of the wave spring, thereby allowing the selector ring to be rotated.

BRIEF DESCRIPTION OF THE DRAWINGS

FIG. 2 provides a raised left front perspective view of the environmentally protected switch and light using same of FIG. 1 and detailing access to the battery compartment;

FIG. 3A provides an exploded view of a lens, electronics and selector for use with an environmentally protected switch and light using same in accordance with an illustrative embodiment of the present invention;

FIG. 3B provides a partial sectional view of a lens and selector for use with an environmentally protected switch and light using same in accordance with an illustrative embodiment of the present invention;

FIGS. 6A and 6B provide left rear raised views of a plug in accordance with an alternative illustrative embodiment of the present invention; and FIGS. 7A and 7B provide left rear raised views of a plug in accordance with a second alternative illustrative embodiment of the present invention; and

DETAILED DESCRIPTION OF THE ILLUSTRATIVE EMBODIMENTS

Figure 1:
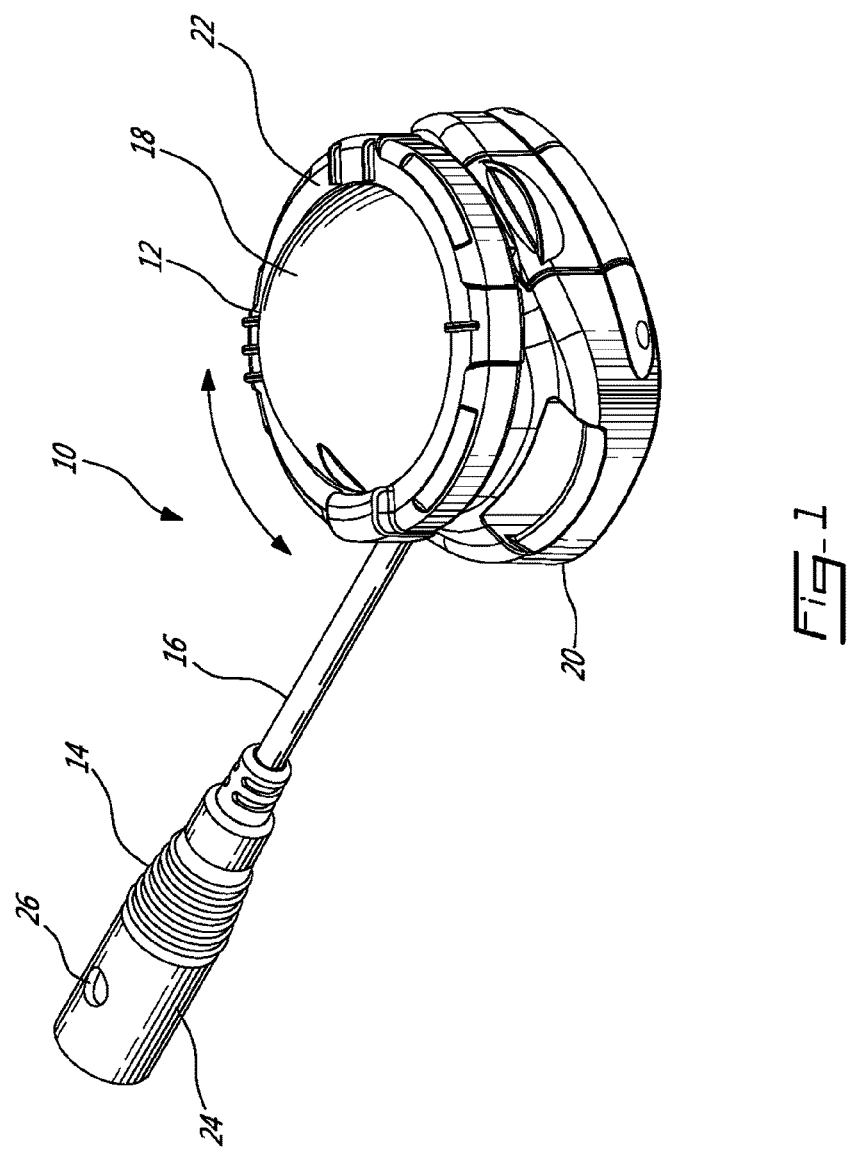
FIG. 1 provides a raised left front perspective view of an environmentally protected switch and light using same in accordance with an illustrative embodiment of the present invention.

Referring now to FIG. 1, an environmentally protected switch and device using same and in accordance with an illustrative embodiment of the present invention will now be described. The switch/device 10 comprises an electronic device 12 and environmentally protected switch 14. The switch 14 is interconnected with the electronic device 12 via a flexible cable 16. The electronic device 12 illustratively comprises a lens 18 manufactured from a transparent or translucent material such as polycarbonate and which is removeably secured to a housing 20. The housing is manufactured from a light non-conducting material such as plastic or the like. A selector ring 22 is mounted for rotation about the lens 18. In this regard, the lens 18 acts as a hub about which the selector ring 22 rotates for selecting one of a predetermined number of functions. Illustratively four (4) functions are provided including an "off" function. The environmentally protected switch 14 comprises an elongate housing 24 surrounding a plurality of conductors (not shown). Immersion of the switch 14 in a conductive fluid allows fluid to enter the elongate housing 24 via the end of the elongate housing as well as one or more optional orifices as in 26, illustratively of between 1 mm and 3 mm in diameter, thereby completing a conductive circuit (also not shown).

Referring now to FIG. 2, the lens 18 is secured to the electronic device 12 via a hinge 28, allowing a forward edge of the lens 18 to be raised away from the electronic device 12 exposing a battery receiving compartment 30 therein. In an illustrative embodiment the hinge 28 can be a snap-type hinge (not shown) allowing the lens 18 to be removed from the electronic device 12, for example for replacement or cleaning. The compartment is illustratively sized to house a standard CR123 type battery 32 therein. A user actuatable latch mechanism 34 is provided comprising a hinge 36 and which releasably secures a corresponding tab 38 therein thereby releasably closing the lens 18 against the electronic device 12. Provision of a rubber O-ring 40 limits the egress of water and dirt and the like into the battery receiving compartment 30 when the lens 18 is secured against the electronic device 12.

Still referring to FIG. 2, in the event that the battery 32 is to be replaced, the latch mechanism 34 is easily actuated by pulling the raised tab 42 on the front of the latch mechanism 34, thereby releasing the corresponding tab 38. Electronics 44, such as a printed circuit board, microprocessor(s) mounted on the PCB, and one or more LEDs (all not shown) are mounted within the lens 18 and for removal therewith. When inserted into the battery receiving compartment 30, each pole 46, 48 of the battery 32 is interconnected with a respective one of a pair of conductive strips as in 50. When the lens 18 is secured to the housing 20 via the latch mechanism 34, the strips as in 50 come into contact with respective conductive pads (not shown) on the underside of the PCB 52 and thereby providing a source of power to the electronics 44. Similarly, and as will be discussed in more detail below, a pair of conductive springs as in 54 which are interconnected with the switch 14 come into contact with respective conductive pads 56 on the underside of the PCB 52.

Referring now to FIG. 3A, as discussed above the selector ring 22 is mounted for rotation about the lens 18. The rotational position of the selector ring 22 is sensible by the electronics and the microprocessor to select a corresponding one of a predetermined number of functions and as also discussed, rotating the selector ring 22 provides access to a plurality of functions. Function selection is carried out through a magnet 58 (for illustration purposes shown outside of the selector ring 22) imbedded in a boss 59 molded on the selector ring 22 and which rotates therewith, and which interacts with an adjacent one of a plurality of reed switches 60 or hall effect devices or the like mounted on the PCB 52 and surrounding a light emitting LED 61 or the like.

Referring to FIG. 3B in addition to FIG. 3A, during assembly the selector ring 22 is secured to the lens 18 by a plurality (illustratively four) raised tabs 62 projecting inwards from an inner surface of the selector ring 22 which engage a groove 64 molded or otherwise formed in an outer cylindrical surface of the lens 18. A single turn wave spring 66 is positioned between an underside 68 of the selector ring 22 and a collar, or annular ledge, 70 molded or otherwise fashioned around the perimeter of the lens 18, thereby forcing the selector ring 22 upwards vis-a-vis the lens 18. About the perimeter of the groove 64 are a plurality of tab receiving notches 72, one for each raised tab 62. As a person of skill in the art will now understand, as the selector ring 22 is rotated about the lens 18, the raised tabs 62 are forced or biased upwards in the groove 64 by the wave spring 66 and engaged at predetermined positions by the notches 72, thereby limiting the travel of the selector ring 22 about the lens when not being forced down by a user.

Referring back to FIG. 3A, illustratively the wave spring 66 comprises four (4) waves 74. The wave spring 66 further comprises a tab 76 which engages a notch (not shown) molded or otherwise formed in the inside of the selector ring 22, thereby ensuring that the wave spring 66 rotates with the selector ring 22 and such that the waves 74 remain positioned immediately adjacent a respective raised tab 62.

As it is foreseen to use the switch and electronic device in conditions of low visibility, such as in darkness or the like, the outer surface of the selector ring 22 comprises groups of raised ridges as in 78, one for each of the predetermined selector positions. By aligning one or other of the groups of raised ridges as in 78 with a raised projection 80 on the outer surface of the lens 18 the user is provided with a tactile indication of the current predetermined position of the selector ring 22. Illustratively four (4) predetermined positions are provided one of which is illustratively an "off" type position. The remaining three (3) positions are respectively provided with groups of one (1), two (2) and three (3) ridges as in 78 to provide the user with an indication of the particular function selected when the selector is placed in one or other of these positions. Illustratively the first position indicated by a single ridge as in 78 might be steady on, the second position indicated by two ridges as in 78 might be flashing and the third position indicated by three ridges as in 78 might flash according to the 3 short, 3 long, 3 short SOS signal.

Additionally, the PCB 52 comprises a notch 82 which engages a complementary ridge on the inside of the lens 18 thereby ensuring that the switches 60 remain keyed to the positions of the selector ring 22.

Still referring to FIGS. 3A and 3B, in order to move the selector ring 22 from one predetermined position to the next, the user disengages the raised tabs 62 from their respective notches 72 by forcing the selector ring 22 downwards against the bias of the wave spring 66 and rotating the selector ring 22. Typically the selector ring 22 is released once the notch 72 is cleared allowing the raised tabs 64 to travel in the groove 64 until the next predetermined position is reached, at which point the raised tabs 62 are engaged by the notches 72 and selector ring 22 snaps upward into position under bias of the wave spring 66. This provides tactile feedback to the user that one or other of the predetermined positions has been reached as well as ensuring that the selector is later not inadvertently dislodged from the selected one of the predetermined positions.

Figure 4:
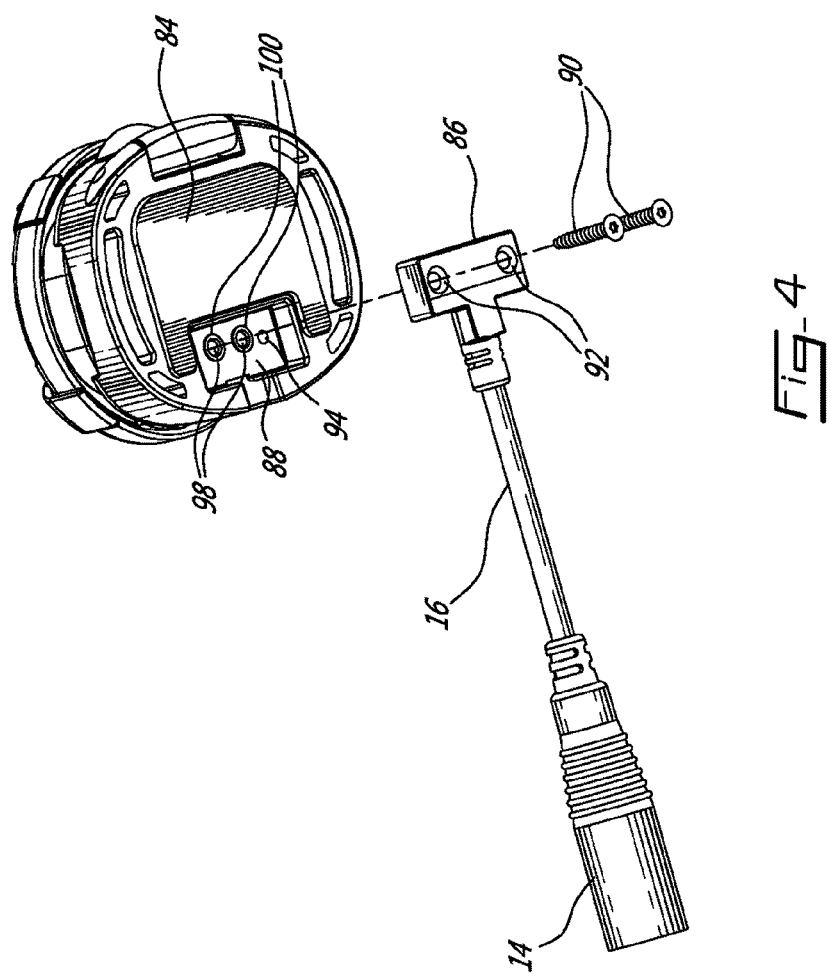
FIG. 4 provides a lowered side view of an environmentally protected switch and light using same detailing the connection between the switch and light and in accordance with an illustrative embodiment of the present invention.

Referring now to FIG. 4, as discussed above the switch 14 is coupled to the flexible insulated two conductor cable 16 which is in turn secured to the base 84 of the electronic device 12 via a plug 86. The plug 86 mates with a receptacle 88 molded or otherwise formed in the base 84 and is illustratively removeably secured within the receptacle 88 by a pair of screws 90 which are each inserted through holes or bores as in 92 in the plug and tightened into respective complementary screw receiving holes 94 within the receptacle 88.

Figure 5A:
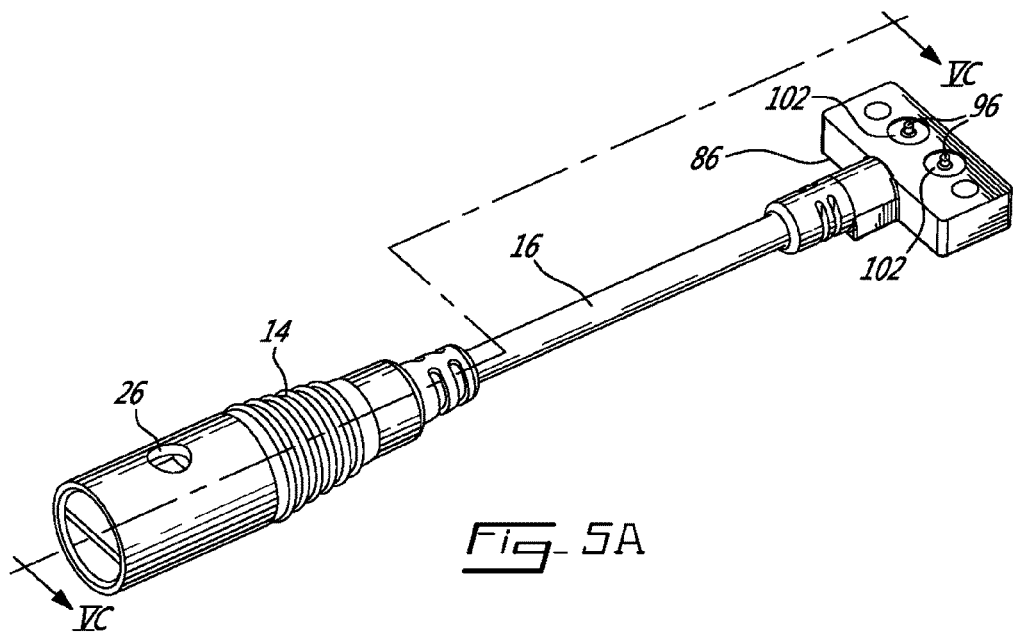
FIG. 5A provides a raised side view of an environmentally protected switch in accordance with an illustrative embodiment of the present invention.

Referring to FIG. 5A in addition to FIG. 4, the plug 86 comprises a pair of conductive pins 96 which, when the plug 86 is inserted into the receptacle 88 each come into contact with respective contacts 98 disposed within the receptacle 88. Additionally, a pair of raised rings as in 100 and each concentric with a respective contact 98 are molded within the receptacle 88. A pair of complementary indentations as in 102 are provided in the plug 86 and concentric with a respective one of the conductive pins 96 and such that when the plug 86 is inserted into the receptacle, each raised ring 100 is received within a respective indentation 102, thereby providing an improved seal against the ingress of water and the like.

Referring back to FIG. 2 in addition to FIG. 5A, the contacts 98, which are illustratively cup shaped each receive an end of a respective spring 54, and with which they are in electrical contact. As discussed above, each of the springs as in 54 comes into contact with a respective conductive pad 56 on the underside of the PCB 52. The springs 54 also serve to bias the contacts 98 towards their respective conductive pin as in 96.

Figure 5B:
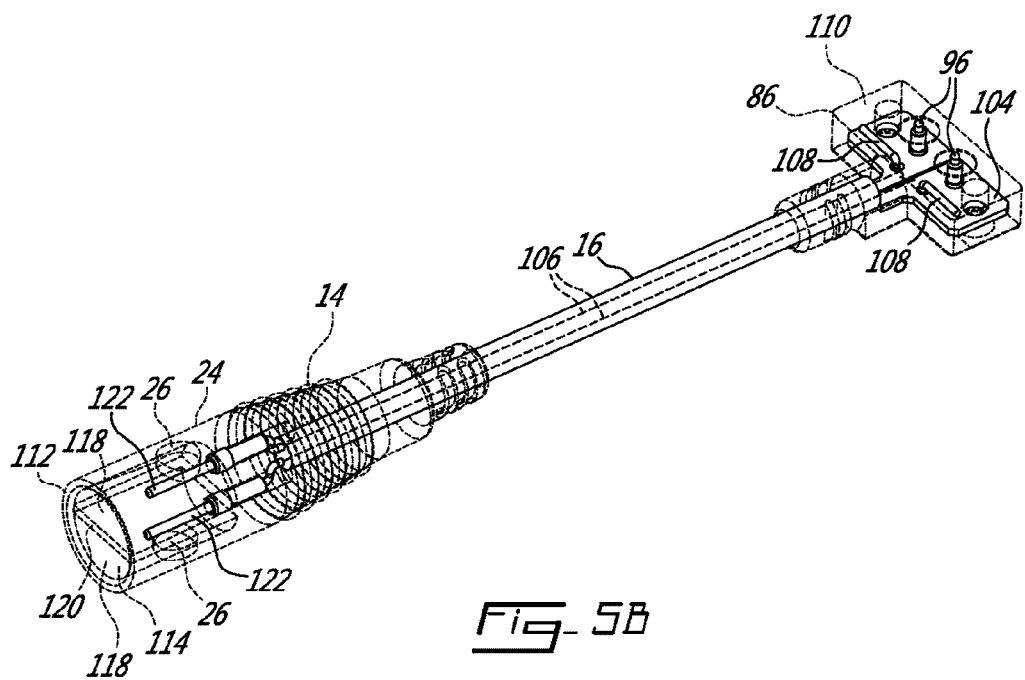
FIG. 5B provides a transparent raised side view of the environmentally protected switch of FIG. 5A.

Referring now to FIG. 5B, the plug 86 further comprises a printed circuit board (PCB) 104 onto which the pair of conductive pins 96 are soldered or otherwise electrically interconnected. The flexible cable 16 comprises a pair of conductors 106 the ends 108 of which are also soldered or otherwise electrically interconnected with the PCB 104 and respective ones of the conductive pins 96. The PCB assembly is over molded with a plastic housing 110.

Referring to 5C in addition to FIGS. 5A and 5B, as discussed above the environmentally protected switch 14 comprises a water resistant outer housing, or shroud, 24. The housing 24 is hollow, and a forward end 112 of the housing defines an opening 114, or open end, which is illustratively circular and between 7 mm and 20 mm in diameter, and through which water 116 or other conducting fluid can penetrate into the opening 114. The hollow housing 24 is divided longitudinally into two chambers or compartments 118 by a water resistant partition 120. An end of one of a pair of probes 122 is exposed within a respective compartment 118 at an end opposite the opening 114. Illustratively, the probe is elongate and extends into its respective compartment as in 118 at least such that it is at least opposite its respective orifice as in 26, illustratively such that an end of the probe is located between their respective orifices as in 26 and the opening 114. Each of the probes 122 is connected to a respective one of the pair of conductors 106. As discussed briefly above, the housing 24 may include orifices 26, one for each compartment 118, which allow air to escape when water 116 or other conducting fluid infiltrates the compartments as in 118. The dimensions of the opening 114, probes as in 122 and orifices as in 26 can be adjusted such they meet operational requirements in different environments. Illustratively, the orifices as in 26 are small enough that they prevent water droplets or the like from entering but large enough that they allow air to easily escape from their respective compartments as in 118 when water enters via the opening 114.

Figure 5C:
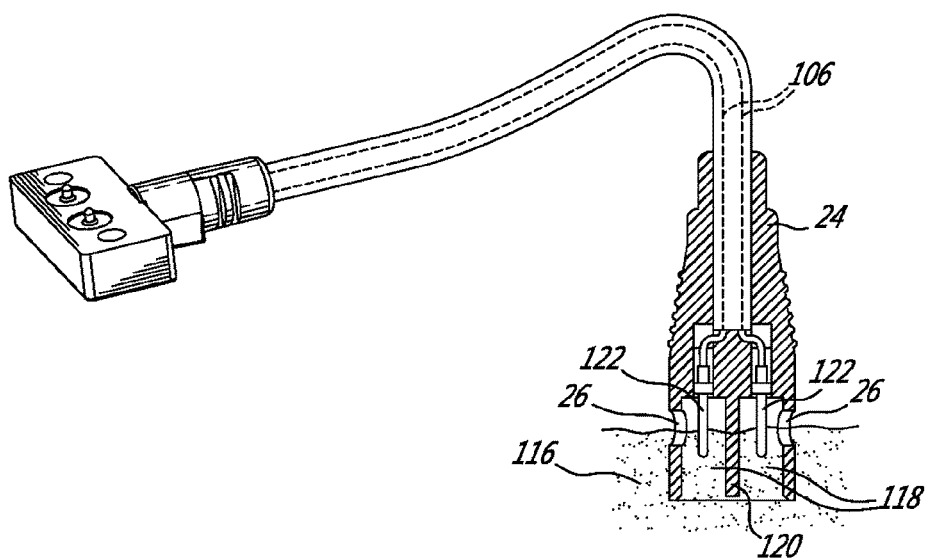
FIG. 5C provides a partial sectional view of an environmentally protected switch along line VC-VC in FIG. 5A.

Still referring to FIG. 5C, in operation when the switch 14 is submerged in water or other conducting fluid, the fluid enters the compartments 118 illustratively while air exits the orifices 26 and shorts, or electrically interconnects, the pair of probes or terminal contacts 122. The short serves as an input to the electronics 44 which, for example, energizes the one or LEDs such that they emit a flashing light sequence, or the like.

Referring back to FIG. 5B, as discussed above the plug 86 comprises a PCB 104 onto which the pair of conductive pins 96 are electrically interconnected, the ends 108 of the pair of conductors 106 are electrically interconnected with the PCB 104 and respective ones of the conductive pins 96 and the assembly is over molded with a plastic housing 110. Referring now to FIGS. 6A and 6B, in a first alternative embodiment of the plug 86, the PCB 104 is divided into two parts 124, 126 one of which terminates each conductor 106 and onto which a respective conductive pin 96 is soldered or otherwise mounted. When the PCB assembly is over molded with a plastic housing 128 plastic is forced into the gap 130 between the PCBs thereby separating the PCBs 124, 126 and preventing inadvertent short circuiting if water inadvertently infiltrates the housing 128.

Referring now to FIGS. 7A and 7B in a second alternative embodiment of the plug 86 a hard plastic base 132 is provided and comprising a pair of indentations 134, 136 into which the PCBs 124, 126 are inserted and then over molded with the plug housing 128. The indentations 134, 136 are separated by a ridge 138 which when over molded separates the PCBs 124, 126 and prevents inadvertent short circuiting if water inadvertently infiltrates the housing 128.

Although the present invention has been described hereinabove by way of specific embodiments thereof, it can be modified, without departing from the spirit and nature of the subject invention as defined in the claims.

I claim:

1. An environmentally protected switch for activating an electronic device in the presence of a conductive fluid, the switch comprising:
    a hollow elongate housing comprising an open end;
    a partition dividing said elongate housing longitudinally into two elongate chambers; and
    a flexible insulated two conductor cable, each of said conductors coupleable at a first end to the electronic device and terminated at a second end by a respective one of a pair of probes wherein each of said probes is positioned in a respective one of said elongate chambers and at an end opposite said opening;
    wherein upon submersion of said elongate housing into the conductive fluid, the fluid penetrates each of said chambers, the conductive fluid electrically interconnecting said first probe and said second probe to enable an electrical current to flow between said first probe and said second probe for closing an electrical path and activating the electronic device.

2. The switch of claim 1, further comprising at least one orifice in a side of said hollow elongate housing.

3. The switch of claim 2, comprising a pair of said orifices on either side of said elongate housing, each of said orifices penetrating into a respective one of said chambers.

4. The switch of claim 3, wherein each of said orifices is positioned opposite a respective one of said pair of probes.

5. The switch of claim 1, wherein each of said at least one orifices is dimensioned small enough to prevent water droplets entering and large enough to allow air to escape from said respective chamber.

6. The switch of claim 5, wherein each of said at least one orifices is circular and between 1 mm and 3 mm in diameter.

7. The switch of claim 1, wherein said open end is circular and between 7 mm and 20 mm in diameter.

8. The switch of claim 1, wherein said first end of said conductor cable is terminated by a plug comprising a pair of exposed conductive pins, each of said conductive pins terminating a respective one of said conductors, the electronic device comprises a receptacle configured for receiving said plug and further wherein when said plug is inserted into said receptacle said conductive pins come into contact with a respective one of a pair of contacts disposed within the receptacle.

9. The switch of claim 8, wherein said plug is retained in the receptacle by at least one screw.

10. A water activated device comprising:
a battery;
a light source comprising at least one LED;
an environmentally protected switch for activating an electronic device in the presence of a conductive fluid, the switch comprising:
  a hollow elongate housing comprising an open end;
  a partition dividing said elongate housing longitudinally into two elongate chambers; and
  a flexible insulated two conductor cable, each of said conductors coupleable at a first end between said battery and said light source and terminated at a second end by a respective one of a pair of probes wherein each of said probes is positioned in a respective one of said elongate chambers and at an end opposite said opening;
wherein upon submersion of said elongate housing into the water, the water penetrates each of said chambers, the water electrically interconnecting said first probe and said second probe to enable an electrical current to flow between said first probe and said second probe for closing an electrical path between said battery and said light source and illuminating said at least one LED.

11. The device of claim 10, wherein said light source further comprises a printed circuit board (PCB) and wherein said at least one LED and electronics comprising a microprocessor are mounted on said PCB.

12. The device of claim 11, further comprising a device housing manufactured from a non-conducting material and configured for receiving said battery, a lens removeably secured to said housing and covering said at least one LED, and a selector ring mountable for rotation about said lens, such that the rotational position of said selector ring is sensible by said electronics and said microprocessor to select a corresponding one of a predetermined number of functions.

13. The device of claim 12, wherein said selector ring rotates for selecting one of four of said functions, wherein one of said four functions is an off function.

14. The device of claim 12, wherein said lens is secured to said device housing via a hinge, said hinge allowing a forward edge of said lens to be raised away from the electronic device exposing said battery inside said device housing.

15. The device of claim 12, wherein said device housing is sized to receive a standard CR123 type battery therein.

16. The device of claim 14, further comprising a user actuatable latch mechanism opposite said hinge, said latch mechanism releasably securing said lens against said device housing.

17. The device of claim 16, wherein each pole of said battery is interconnected with a respective one of a pair of conductive strips, such that when said lens is secured to said housing via said latch mechanism, said strips come into contact with respective conducting pads on the underside of said printed circuit board, thereby providing a source of power to said electronics.

18. The device of claim 12, wherein said electronics comprise a plurality of reed switches and further comprising a magnet imbedded in said selector ring, wherein rotation of said selector ring causes closing of one of said plurality of reed switches mounted on said PCB and thereby providing said microprocessor said rotational position of said selector ring.

* * * * *